(12) United States Patent
Takahashi et al.

(10) Patent No.: US 7,307,892 B2
(45) Date of Patent: Dec. 11, 2007

(54) SEMICONDUCTOR INTEGRATED CIRCUIT

(75) Inventors: Motoi Takahashi, Kawasaki (JP); Ikuto Fukuoka, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 93 days.

(21) Appl. No.: 11/359,363

(22) Filed: Feb. 23, 2006

(65) Prior Publication Data
US 2006/0221716 A1 Oct. 5, 2006

(30) Foreign Application Priority Data
Mar. 31, 2005 (JP) ............... 2005-102035

(51) Int. Cl.
G11C 7/10 (2006.01)
(52) U.S. Cl. ............... 365/189.01; 365/189.05; 365/230.05
(58) Field of Classification Search .......... 365/189.01, 365/189.05, 230.05, 230.06, 189.04, 189.09
See application file for complete search history.

(56) References Cited

U.S. PATENT DOCUMENTS 5,717,638 A * 2/1998 Kim ............ 365/189.04

6,958,948 B2 * 10/2005 Shiraishi ............ 365/230.05

FOREIGN PATENT DOCUMENTS

| JP | 04-095184 A | 3/1992 |
|----|-------------|--------|
| JP | 06-187468 A | 7/1994 |
| JP | 06-231587 A | 8/1994 |

* cited by examiner

Primary Examiner—Son Dinh
Assistant Examiner—Dang Nguyen
(74) Attorney, Agent, or Firm—Arent Fox LLP

(57) ABSTRACT

A function switching part has a pair of programming elements programmed to different logic values. A decision circuit in the function switching part outputs a logic level according to a difference between the currents flowing in the programming elements, while the power supply voltage rises at the power-on. The operating specification of an option functional part is switched according to the logic level output from the decision circuit. That is, the operating specification of the option functional part is automatically decided according to the program state of the programming element before the power-on operation is completed. The read operation for the programming element need not be performed for deciding the operating specification of the option functional part. Since the initial process after the power-on period is simplified, the period from when the power is turned on to when the normal operation begins can be shortened.

14 Claims, 10 Drawing Sheets

| signal | erase operation | program operation | |
|---|---|---|---|
| | | programming MC1 | programming MC2 |
| RSA | -9V | +9V | +9V |
| CS1A | VDD | VSS | +5V |
| CS2A | VDD | +5V | VSS |
| SC1A | VSS | +5V | +5V |
| SC2A | +5V | VSS | VSS |
| DCA | VSS | VDD | VDD |

Fig. 3

| signal | erase operation | program operation ||
| | | programming MC3 | programming MC4 |
|---|---|---|---|
| RSA | -9V | +9V ||
| CS1 | VDD | VSS | +5V |
| CS2 | VDD | +5V | VSS |
| SC1 | VSS | +5V ||
| SC2 | +5V | VSS ||
| DC | VSS | VDD ||

Fig. 7

SEMICONDUCTOR INTEGRATED CIRCUIT

CROSS REFERENCE TO RELATED APPLICATION

This application is based upon and claims the benefit of priority from Japanese Patent Application No. 2005-102035, filed on Mar. 31, 2005, the entire contents of which are incorporated herein by reference.

BACKGROUND OF THE INVENTION

1. Field of the Invention

The present invention relates to a semiconductor integrated circuit having a function switching part for switching a built-in option function.

2. Description of the Related Art

Generally, a semiconductor integrated circuit such as a microcontroller has a common function, which is common to all users, and an option function of which the operating specification can be changed in accordance with the user's wish. Conventionally, in order to switch the option function, the semiconductor integrated circuit has a nonvolatile memory cell, a control circuit that accesses the nonvolatile memory cell, and a latch circuit that latches data read from the nonvolatile memory cell and the like. The control circuit executes a read operation of the nonvolatile memory cell after power-on operation is completed. By latching the read data to the latch circuit, the option function is switched (for example, see Japanese Unexamined Patent Application Publication No. Hei 4-95184, Japanese Unexamined Patent Application Publication No. Hei 6-187468).

In a conventional method, in order to switch the option function, the control circuit needs to perform the read operation by setting the control gate, source and drain of the nonvolatile memory cell to a predetermined voltage. Specifically, the option function can be switched only after a power supply voltage is increased up to a voltage, which is required for operating the control circuit. For example, in the case that the option function is set whenever the power is turned on, the option function can be set only after the power-on operation is completed and thus the power supply voltage is stable. Accordingly, there is a problem in that the period from when the power is turned on to when a normal operation begins becomes long. In a program executable semiconductor integrated circuit such as a microcomputer, the option function must be set in an initializing routine (user program) after the power is turned on. Accordingly, it imposes a heavy burden on a user. Also, there is also a problem in that the size of the control circuit becomes increased.

SUMMARY OF THE INVENTION

It is an object of the present invention to shorten the period from when a semiconductor integrated circuit is turned on to when a normal operation begins by switching an option function during the power-on period, and, particularly, to shorten the period without increasing the circuit size.

In a semiconductor integrated circuit according to the present invention, a function switching part has a pair of programming elements to be programmed to different logic values. The decision circuit of the function switching part is connected to the programming elements and outputs a logic level according to a difference between the currents flowing in the programming elements while the power supply voltage rise at the power-on. The operating specification of an option functional part is switched according to the logic level output from the decision circuit. That is, the operating specification of the option functional part is automatically decided according to the program state of the programming element before the power-on operation is completed.

The read operation for the programming element need not be performed for deciding the operating specification of the option functional part. This makes a control circuit for the read operation unneeded and can thus reduce the circuit scale. Since the read operation is not needed, the initial process after the power-on period is simplified in a user system on which the semiconductor integrated circuit is mounted. Accordingly, the period from when the power is turned on to when the normal operation begins can be shortened. Also, a reset signal for deciding the operating specification of the option functional part is not needed. The operating specification of the option functional part is decided according to stored values of a pair of programming elements programmed to different logic values. Thereby, the decision circuit can surely decide the operating specification of the option functional part, compared with a case that the operating specification is decided by one programming element. In other words, the malfunction of the decision circuit can be prevented.

In the semiconductor integrated circuit according to a preferred embodiment of the present invention, each of the programming elements is a nonvolatile memory cell composed of a read transistor and a write transistor. The read transistor and the write transistor have a common conductive floating gate which stores charges therein. The nonvolatile memory cell is programmed using the write transistor and is read using the read transistor. That is, the program operation and the read operation of the nonvolatile memory cell can be performed using different transistors. Thereby, the structure (characteristic) of the write transistor and the read transistor can be optimally designed for their operations.

In the semiconductor integrated circuit according to a preferred embodiment of the present invention, the control gate of the read transistor is connected to a ground line. A pair of the nonvolatile memory cells is set in a state that a threshold value is negative and in a state that the threshold value is positive, respectively. At the power-on timing, the current flows in the nonvolatile memory cell of which the threshold voltage is negative, and the current does not flowing in the non-volatile memory cell of which the threshold voltage is positive. Thereby, the currents flowing in the nonvolatile memory cells are made different from each other, and thus the decision margin of the decision circuit can be sufficiently ensured.

In the semiconductor integrated circuit according to a preferred embodiment of the present invention, each of the programming elements is composed of the nonvolatile memory cell. The nonvolatile memory cell has a conductive floating gate which stores charges therein and a control gate which stores or emits charges to the floating gate. Alternately, the nonvolatile memory cell has an insulative trap gate which traps charges and a control gate which traps or emits carriers to the trap gate. Setting a pair of nonvolatile memory cells in the erase state and the write state differently makes it possible to ensure the decision margin of the decision circuit.

In the semiconductor integrated circuit according to a preferred embodiment of the present invention, in order to store (or trap) or emit carriers to the floating gate (or the trap gate), a write control unit applies a predetermined voltage to the control gate, the source, and the drain of the nonvolatile memory cell. Thereby before the power-on period, the nonvolatile memory cell can be programmed using the write control unit in a semiconductor manufacturing process or a user system.

In the semiconductor integrated circuit according to a preferred embodiment of the present invention, each of the programming elements is a fuse. By cutting one of a pair of fuses in advance, values of the currents flowing in the programming elements are made differentiated from each other. Thereby, the decision margin of the decision circuit can be sufficiently ensured.

In the semiconductor integrated circuit according to a preferred embodiment of the present invention, the decision circuit has a pair of inverting circuits whose input and output are connected to each other. In one of the inverting circuits, a first power supply terminal is connected to a first power supply line and a second power supply terminal is connected to one of the pair of programming elements. In the other inverting circuit, a first power supply terminal is connected to a first power supply line and a second power supply terminal is connected to the other of the programming elements. Thereby, at the power-on timing, the voltage of the second power supply terminal corresponding to the programming element in which a lot of current flows becomes relatively lower. The inverting circuit having the second power supply terminal outputs a low logic level. The voltage of the second power supply terminal corresponding to the programming element in which a little current flows is relatively higher. The inverting circuit having the second power supply terminal outputs high logic level. The operating specification of the option functional part is switched according to the logic level output from at least one of the inverting circuits. Accordingly, the decision operation of the decision circuit can be surely performed according to the program state of the programming element.

In the semiconductor integrated circuit according to a preferred embodiment of the present invention, each of the inverting circuits is a CMOS inverter having a pMOS transistor and an nMOS transistor which are serially connected to each other. The source of the pMOS transistor is the first power supply terminal and connected to a high voltage line as the first power supply line. The source of the nMOS transistor is the second power supply terminal and connected to a low voltage line as a second power supply through the programming element.

At the power-on timing, when the power supply voltage (difference between the voltage of the high voltage line and the voltage of the low voltage line) is greater than the sum of the threshold voltages (absolute value) of the pMOS transistor and the nMOS transistor of the CMOS inverter, each transistor is turned on and the feedthrough current temporarily flows. Thereby, the output of the CMOS inverter corresponding to the programming element in which a lot of current flows becomes the low level. The output of the CMOS inverter corresponding to the programming element in which a little current flows becomes the high level. After the output level of the CMOS inverter, one of the pMOS transistor and the nMOS transistor of each CMOS inverter is held in the OFF state. Thereby, after the logic level is decided, the feedthrough current is prevented from flowing in the CMOS inverter. Accordingly, after the operating specification of the option functional part is switched, unnecessary current can be prevented from flowing in the function switch function. At this result, standby current of the semiconductor integrated circuit can be prevented from being increased.

BRIEF DESCRIPTION OF THE DRAWINGS

The nature, principle, and utility of the invention will become more apparent from the following detailed description when read in conjunction with the accompanying drawings in which like parts are designated by identical reference numbers, in which:

FIG. 3 illustrates an erase operation and a program operation of a memory cell shown in FIG. 2;

FIG. 7 illustrates an erase operation and a program operation of a memory cell shown in FIG. 6;

DESCRIPTION OF THE PREFERRED EMBODIMENT

Figure 1:
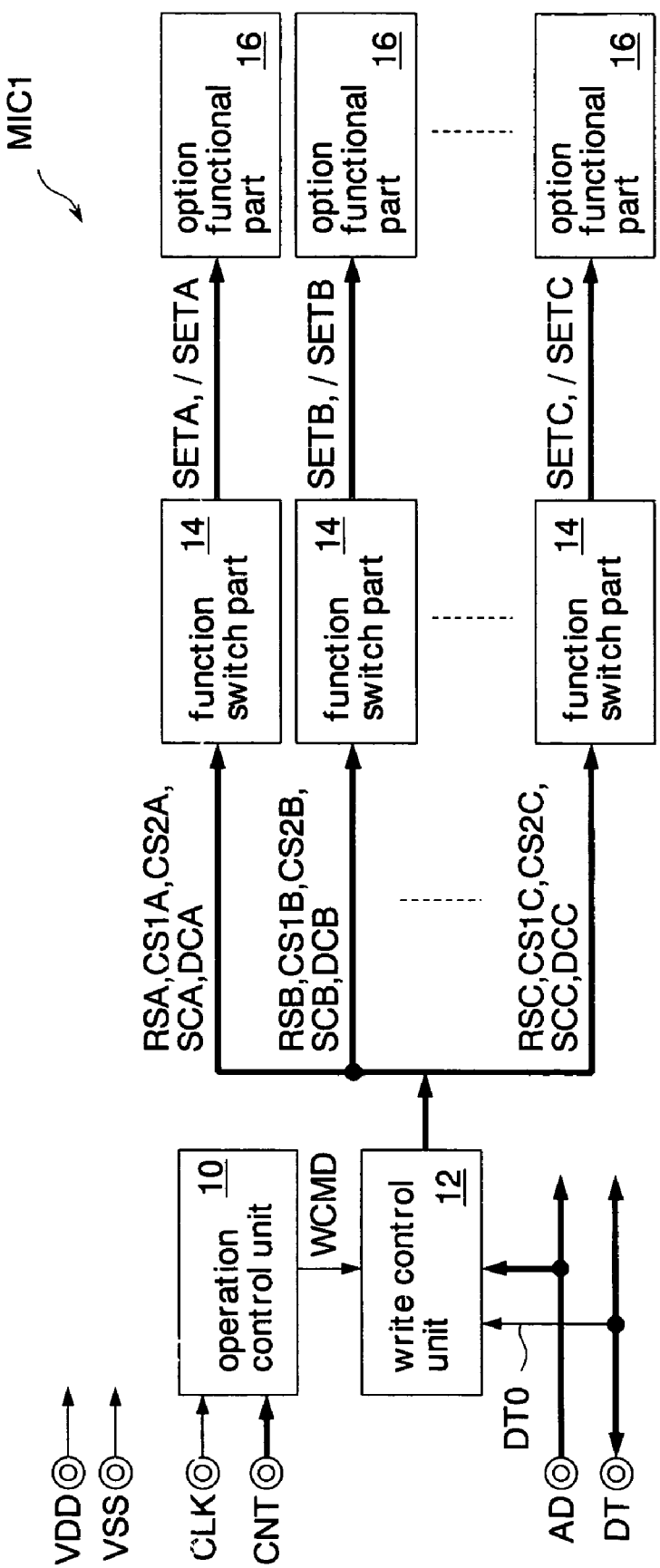
FIG. 1 is a block diagram showing a semiconductor integrated circuit according to a first embodiment of the present invention.

Preferred embodiments of the present invention will now be described with reference to the accompanying drawings. In the drawings, a double circle denotes an external terminal. In the drawings, there is a plurality of signal lines, which is represented by the bold-lines. Further, a portion of blocks connected with the bold-line is composed of a plurality of circuits. A signal line applied with a signal is denoted by a reference number which is equal to the signal name thereof.

FIG. 1 is a block diagram showing a semiconductor integrated circuit according to a first embodiment of the present invention. The semiconductor integrated circuit is formed as a microcontroller MIC1 using a CMOS process technology. The microcontroller MIC1 has an operation control unit 10, a write control unit 12, a plurality of function switching parts 14, and a plurality of option functional parts 16. The microcontroller MIC1 also has peripheral circuits such as a CPU, a ROM, a RAM, a timer, a serial communication, and an I/O port which are not shown in drawings. The microcontroller MIC1 receives a clock signal CLK, a control signal CNT, an address signal AD and inputs/outputs a data signal DT. The microcontroller MIC1 receives an external power supply voltage VDD (for example, 2.5 V) and a ground voltage VSS (0V).

The operation control unit 10 receives the control signal CNT in synchronization with the clock signal CLK. The operation control unit 10 activates a write command signal WCMD during a predetermined period when the control signal CNT represents a write command. In addition, when the below-mentioned option function is set before the shipment of the microcontroller MIC1, the write command is not open to a user. In this case, in the shipping test of the microcontroller MIC1, the write command is supplied to the microcontroller MIC1 and the option function is set.

The write control unit 12 receives the address signal AD and the data signal DT (the lowest bit DT0) in synchronization with the activation of the write command signal WCMD. The write control unit 12 outputs the control signals RS (RSA, RSB, RSC), CS1 (CS1A, CS1B, CS1C), CS2 (CS2A, CS2B, CS2C), SC1 (SC1A, SC1B, SC1C), SC2 (SC2A, SC2B, SC2C) and DC (DCA, DCB, DCC) for changing the setting state (the stored states of the nonvolatile memory cells MC1 and MC2 to be described later) of the function switching part 14 which is specified according to the address signal AD. The stored state (logic 1 or logic 0) is changed in correspondence to the logic level of the lowest bit DT0 of the data signal. In this way, since the operation control unit 10 and the write control unit 12 rewrite the stored states of the memory cells MC1 and MC2 during the output of the write command signals WCMD, the memory cells MC1 and MC2 can be programmed by external control.

The function switching parts 14 are formed in correspondence to the option functional parts 16, respectively. The function switching part 14 receives the control signals RS, CS1, CS2, SC1, SC2 and DC from the write control unit 12 and changes the stored state. Also, the function switching part 14 outputs the setting signals SET, /SET (SETA, SETB, SETC, /SETA, /SETB, /SETC) in order to initially set the option functional part 16 during the power-on period. The setting signals SET, /SET are complementary logic signals.

The option functional part 16 is initially set according to the logic level of the setting signals SET, /SET and changes the operating specifications of the peripheral circuits such as the timer, the serial communication and I/O port accommodated in the microcontroller MIC1. For example, the option functional part 16 is formed in every peripheral circuit. In this embodiment, the changeable operating specification can be set by the user as the option function. In addition, alphabets which are attached to the ends of the control signals RS, CS1, CS2, SC1, SC2 and DC and the setting signals SET, /SET are the symbols for identifying the option function.

Figure 2:
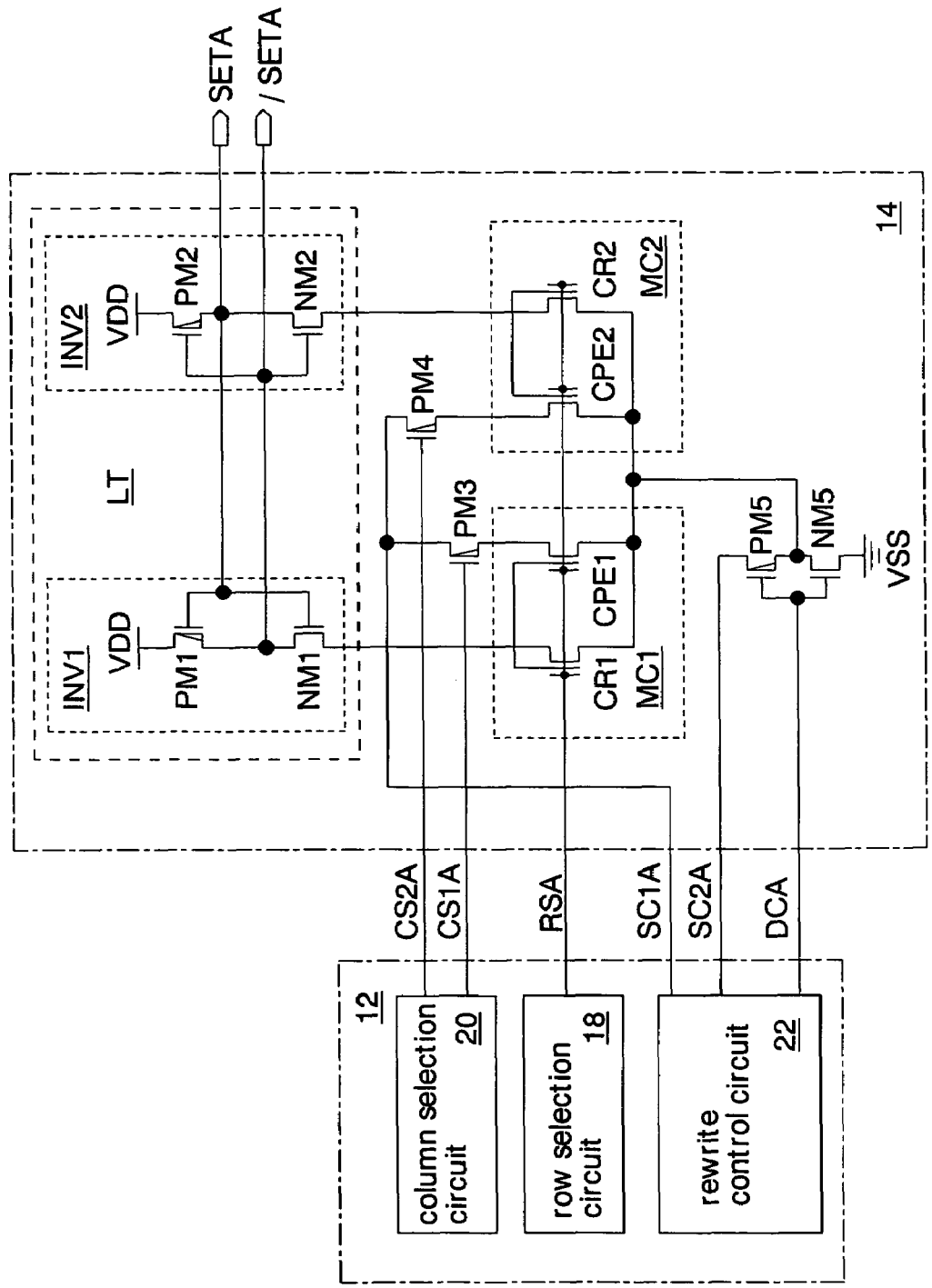
FIG. 2 is a circuit diagram showing in detail a write control unit and a function switching part shown in FIG. 1.

FIG. 2 is a circuit diagram showing in detail the write control unit 12 and the function switching part 14 shown in FIG. 1. In the drawings, the function switching part 14 which receives the control signal RSA or the like attached with "A" at the end thereof is shown. The other function switching part 14 has the same structure as in FIG. 2 except that the different symbol is attached to the end thereof.

The write control unit 12 has a row selection circuit 18, a column selection circuit 20 and a write control circuit 22 in correspondence to the function switching part 14. The write control unit 12 sequentially performs the erase operation and the write operation in order to previously write the complementary logic values to the below-mentioned nonvolatile memory cells MC1 and MC2. The erase operation and the write operation for changing the logic values stored in the memory cells MC1 and MC2 are also referred to as program operation.

The row selection circuit 18 changes the voltage of the control signal RS to a negative (for example, −9 V) or a high voltage (for example, +9 V) in the period that the write command signal WCMD is activated. When the control signal RSA is the negative voltage, the erase operation is performed, and when the control signal RSA is the high voltage, the write operation is performed. Further, although it is not specially limited, the microcontroller MIC1 has a negative voltage generator for generating the negative voltage and a high voltage generator for generating the high voltage.

The column selection circuit 20 holds the control signals CS1A and CS2A in the high level (for example, a power supply voltage VDD) during the erase operation of the period that the write command signal WCMD is activated. The column selection circuit 20 holds the control signals CS1A and CS2A in the high level or the low level, during the write operation of the period that the write command signal WCMD is activated. When the below-mentioned memory cell MC1 is set in the write state (logic 0, high threshold voltage) and the memory cell MC2 is held in the erase state (logic 1, low threshold voltage), in the write operation, the control signals CS1A and CS2A are set to the low level (VSS) and the high level (high voltage, for example, +5 V), respectively. On the contrary, when the memory cell MC1 is held in the erase state and the memory cell MC2 is set in the write state, in the write operation, the control signals CS1A and CS2A are set to the high level (high voltage, for example, +5 V) and the low level (VSS), respectively.

The write control circuit 22 holds the control signals SC1A, SC2A and DCA in the low level (VSS), the high level (high voltage, for example, +5 V) and the low level (VSS), respectively, during the erase operation. The write control circuit 22 holds the control signals SC1A, SC2A and DCA in the high voltage (for example, +5 V), the low level (VSS), and the high level (VDD), respectively, during the write operation. In this way, the write control unit 12 applies a predetermined voltage to the control gate, the source, and the drain of each of the memory cells MC1 and MC2 to program the memory cells MC1 and MC2.

The function switching part 14 has a latch circuit LT (decision circuit), a pair of nonvolatile memory cells MC1 and MC2 (programming element) and an nMOS transistor NM5, pMOS transistors PM3, PM4 and PM5. The latch circuit LT has a pair of CMOS inverters INV1 and INV2 (inverting circuits). The sources (first power supply terminal) of the pMOS transistors PM1 and PM2 of the inverters INV1 and INV2 are connected to the power supply line VDD (first power supply line, high voltage line). The sources (second power supply terminal) of the nMOS transistors NM1 and NM2 of the inverters INV1 and INV2 are connected to the ends of the memory cells MC1 and MC2, respectively. The output of the inverter INV1 is connected to the input of the inverter INV2 and is output as the setting signal /SETA. The output of the inverter INV2 is connected to the input of the inverter INV1 and outputs the setting signal SETA.

The memory cell MC1 has a read transistor CR1 and a write transistor CPE1. The memory cell MC1 is read using the read transistor CR1 and is programmed using the write transistor CPE1. The floating gates of the read transistor CR1 and the write transistor CPE1 are commonly connected to each other. The connecting node (source) of the read transistor CR1 and the write transistor CPE1 is connected to the control signal line SC2A through pMOS transistor PM5 and is connected to the ground line VSS (second power supply, low voltage line) through the nMOS transistor NM5.

The memory cell MC2 has a read transistor CR2 and a write transistor CPE2. The memory cell MC2 is read using the read transistor CR2 and is programmed using the write transistor CPE2. The conductive floating gates of the read transistor CR2 and the write transistor CPE2 are commonly connected to each other. The connecting node (source) of the read transistor CR2 and the write transistor CPE2 is connected to the control signal line SC2A through PMOS transistor PM5 and is connected to the ground line VSS through the nMOS transistor NM5.

The floating gates of the memory cells MC1 and MC2 are made of polysilicon and the like and have electrical conductivity. For this reason, the charges stored by the write transistors CPE1 and CPE2 affects the characteristic of the read transistors CR1 and CR2. The control gates of the read transistors CR1 and CR2 are connected to the control gate of the write transistors CPE1 and CPE2 and the control signal line RSA. As mentioned below, a pair of the memory cells MC1 and MC2 are set in the state that the threshold voltage is negative and the state that the threshold voltage is positive, respectively. Consequently, at the power-on timing, the current flows in the memory cell (one of the MC1 and MC2) of which the threshold voltage is negative and the current does not flow in the memory cell (the other of MC1 and MC2) of which the threshold voltage is positive, by setting the control signal RSA to the ground voltage VSS. The values of the current flowing in the pair of the memory cells MC1 and MC2 are necessarily different from each other. Accordingly, the decision margin due to the latch circuit (decision circuit) LT can be sufficiently ensured and thus the operating specification of the option functional part 16 can be surely set at the power-on timing.

The program operation and the read operation of the memory cells MC1 and MC2 are performed using different transistors. Therefore, the structure (characteristic) of the write transistors CPE1 and CPE2 and the read transistors CR1 and CR2 can be optimally designed in respective the operations. Particularly, since the write transistors CPE1 and CPE2 are exclusively used for the program (write, erase), it may be designed to have the structure, which endures strong electric field. As a result, the erase operations of the memory cells MC1 and MC2 can be sufficiently performed until the memory cells MC1 and MC2 becomes the over-erased state. Even in this case, the memory cells MC1 and MC2 can be easily reset in the write state. Since the memory cells MC1, MC2 can become the over-erased state, a verify operation for monitoring the threshold voltage during the erase operation is not required. Accordingly, the circuit structure of the write control unit 12 is simplified. Since the memory cells MC1 and MC2 can become the over-erased state and the over-written state, the difference between values programmed to the pair of the memory cells MC1 and MC2 can be set apart. Accordingly, the decision margin due to the latch circuit (decision circuit) LT can be more sufficiently ensured and thus the operating specification of the option functional part 16 more surely set at the power-on timing.

The gates of the pMOS transistor PM5 and the nMOS transistor NM5 receive the control signal DCA. The control gates of the memory cells MC1 and MC2 receive the control signal RSA. The other end (drain) of the memory cell MC1 (or MC2) is connected to the control signal line SC1A through the pMOS transistor PM3 (or PM4). The gates of the pMOS transistors PM3 and PM4 receive the control signals CS1A and CS2A, respectively.

FIG. 3 illustrates the erase operation and the write operation of the memory cells MC1 and MC2 shown in FIG. 2. For example, in the case that the memory cell MC1 is set in the erase state and the memory cell MC2 is set in the write state, the write control unit 12 sequentially perform the erase operation of the memory cell MC1 and the write operation of the memory cell MC2. Further, in the below description, the node to which carriers are applied in the transistor is referred to as the source and the node from which carriers are output is referred to as the drain. The carrier is an electron in the nMOS transistor and is a hole in the PMOS transistor.

In the erase operation, the control signals RSA, CS1A, CS2A, SC1A, SC2A and DCA are set to −9 V, VDD, VDD, VSS, +5 V, VSS, respectively. During the erase operation, the control gates of the write transistors CPE1 and CPE2 are set to the negative voltage (−9 V). The transistor PM5 is turned on and the transistor NM5 is turned off such that the sources of the write transistors CPE1 and CPE2 are set to +5 V. The transistors PM3 and PM4 are turned off such that the drains of the write transistors CPE1, CPE2 are set in the floating state. For this reason, the electrons are emitted from the floating gate to the source (tunnel current). Since the floating gates of the read transistor CR1 (CR2) and the write transistor CPE1 (CPE2) are commonly connected to each other, the threshold voltages of the transistors CR1 and CPE1 (CR2 and CPE2) are decreased. In this embodiment, the threshold voltage becomes the depletion state by the erase operation. That is, the transistors CR1 and CPE1 are turned on when the voltage between the gate and source is 0 V.

On the other hand, in the write operation of the memory cell MC2, the control signals RSA, CS1A, CS2A, SC1A, SC2A and DCA are set to +9 V, +5 V, VSS, +5 V, VSS, and VDD, respectively. The control gates of the write transistors CPE1 and CPE2 are set to the high voltage (+9 V). The transistor PM4 is turned on and the drain of the write transistor CPE2 is set to +5 V. The transistor PM3 is turned off and the drain of the write transistor CPE1 is set in the floating state. The transistor PM5 is turned off and the transistor NM5 is turned on such that the sources of the write transistors CPE1 and CPE2 are set to the ground voltage VSS. For this reason, the current flows only between the drain and source of the memory cell MC2 and the electrons are injected into the floating gate by hot electron injection. Since the floating gates of the read transistor CR2 and the write transistor CPE2 are commonly connected to each other, the threshold voltages of the transistors CR2 and CPE2 are increased. Since the write operation of the memory cell MC1 is not performed, the threshold voltages of the transistors CR1 and CPE1 are held in the depletion state.

Figure 4:
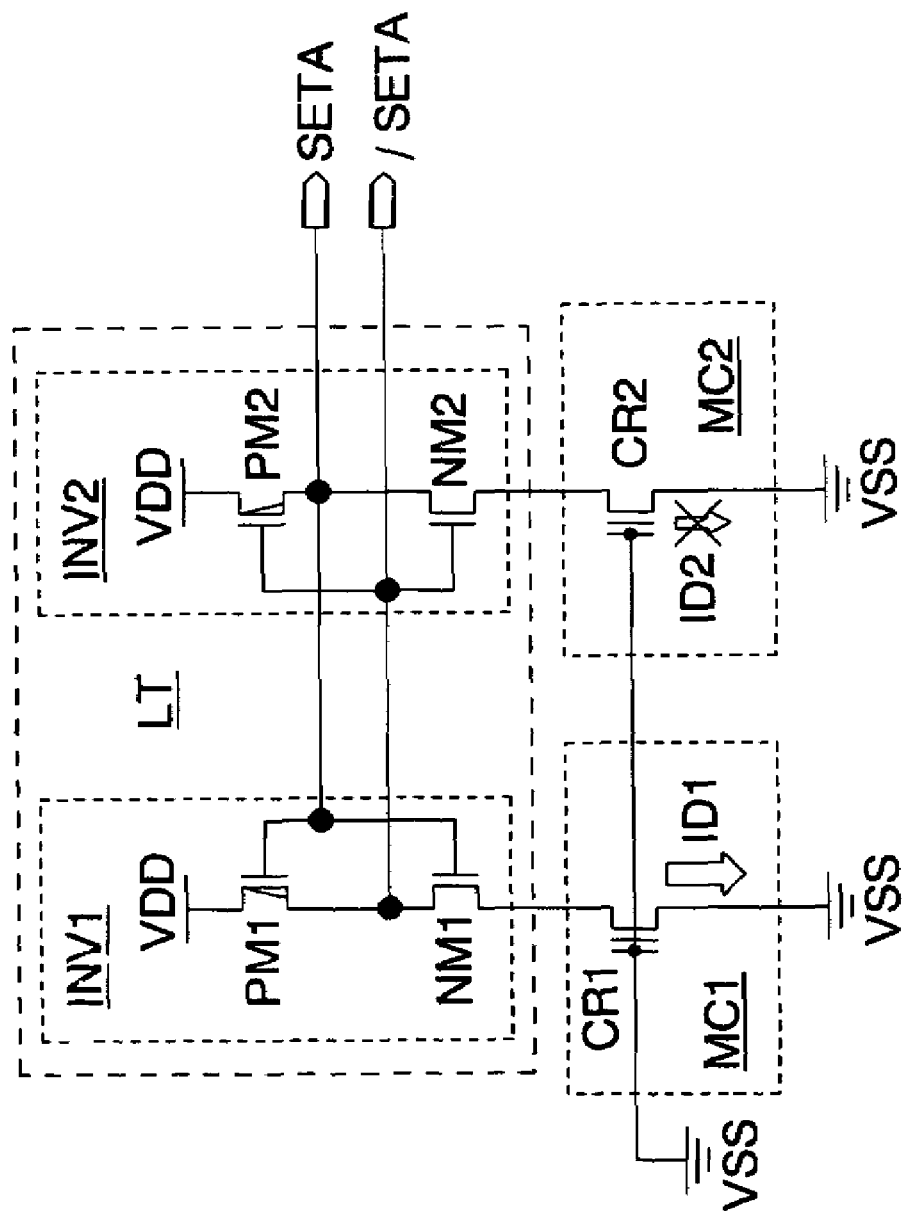
FIG. 4 is a circuit diagram showing a circuit required for deciding a setting signal at the power-on timing, in the function switching part shown in FIG. 2.

FIG. 4 is a circuit diagram showing a circuit required for deciding the setting signals SETA, /SETA at the power-on timing, in the function switching part 14 shown in FIG. 2. Since the transistors CPE1 and CPE2 required for the erase operation and the write operation are not required at the power-on timing and the write control unit 12 is designed such that the transistors PM3, PM4 and PM5 are turned off and the transistor NM5 is turned off at the power-on timing, the structure is more simple than of FIG. 2. Since the transistor PM5 shown in FIG. 2 is set by the write control circuit 22 such that the gate voltage at the power-on timing becomes the power supply voltage VDD, the sources of the read transistors CR1 and CR2 are connected to the ground line VSS at the power-on timing. Accordingly, the transistor PM5 is omitted.

In this example, as mentioned with reference to FIG. 3, previously, the threshold value of the memory cell MC1 is set to the negative voltage (erase state) and the threshold value of the memory cell MC2 is set to the positive voltage (write state). The control gates of the read transistors CR1 and CR2 are connected to the ground line VSS. For this reason, when the voltage is applied between the drain and the source, the cell current ID1 flows only in the memory cell MC1 and the cell current ID2 does not flow in the memory cell MC2.

Figure 5:
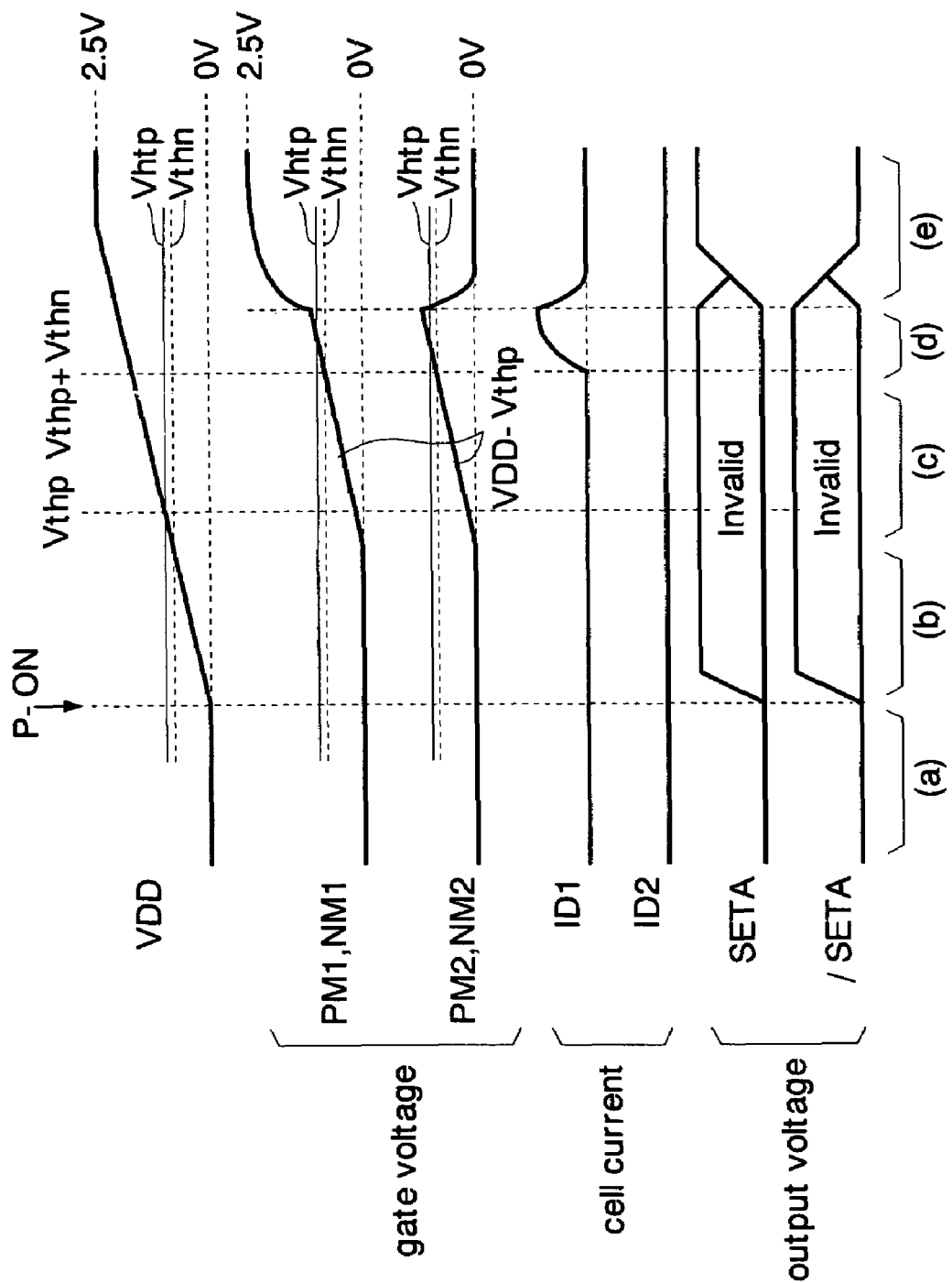
FIG. 5 is a timing chart showing the operation of the function switching part at the power-on timing in the first embodiment.

FIG. 5 shows the operation of the function switching part 14 at the power-on timing in the first embodiment. Before the power-on period (P-ON period), every node is in the ground state (0 V) (FIG. 5(a)).

First, the power supply voltage VDD begins to be supplied to the microcontroller MIC1 (FIG. 5(b)). If the power supply voltage VDD becomes the threshold voltage Vthp (absolute value) of the pMOS transistors PM1 and PM2, the transistors PM1 and PM2 are turned on (ON) and thus the voltage applied to the gates of the transistors PM1, PM2, NM1 and NM2 begins to be increased (FIG. 5(c)). If the power supply voltage VDD becomes greater than the sum of the threshold value Vthp of the PMOS transistors PM1 and PM2 and the threshold voltage Vthn of the nMOS transistors NM1 and NM2, all the transistors PM1, PM2, NM1 and NM2 are turned on and temporary feedthrough current flows in the inverters INV1 and INV2. Since the voltage of VDD-Vthp is applied to the gates of the transistors PM1, PM2, NM1 and NM2, the voltage of VDD-Vthp-Vthn is applied to the drains of the read transistors CR1 and CR2. Since the gates of the read transistors CR1 and CR2 are connected to the ground line VSS, the cell current ID1 flows only in the read transistor CR1 of the depletion state. The cell current ID2 does not flows in the read transistor CR2 (FIG. 5(d)). Accordingly, the voltage of the source (second power supply terminal) of the transistor NM1 of the inverter INV1 becomes lower than the voltage of the source (second power supply terminal) of the transistor NM2 of the inverter INV2. Further, in the periods (b), (c) and (d), the voltages of the setting signals SETA, /SETA output from the latch circuit LT are invalid.

Next, in FIG. 5(e), since the cell current ID2 does not flow, the input voltage of the inverter INV1 (gate voltages of the transistors PM1 and NM1) is increased. By the cell current ID1, the input voltage of the inverter INV2 (gate voltages of the transistors PM2 and NM2) is decreased. The gate voltages of the transistors PM2 and NM2 are dropped to the ground voltage VSS. The gate voltages of the transistors PM1 and NM1 are increased depending on the power supply voltage VDD. Accordingly, the transistors PM1 and NM2 are turned off (OFF) and the transistors PM2 and NM1 are turned on (ON). The output voltage SETA of the inverter INV2 connected to the input of the inverter INV1 is increased. The output voltage /SETA of the inverter INV1 connected to the input of the inverter INV2 is decreased.

By OFF of the transistor PM1, the feedthrough current does not pass through the inverter INV1. Thereby, the cell current ID1 is gradually decreased and becomes zero. By storing the complementary logic data to the pair of the memory cells MC1 and MC2, the output voltage SETA (or /SETA) is surely generated. Also, the operating specification of the option functional part 16 is switched according to the logic level of the output voltages SETA, /SETA. Accordingly, the decision operation of the operating specification of the option functional part 16 due to the latch circuit LT can be surely performed according to the program state of the memory cells MC1 and MC2.

In FIG. 5(e), before the power supply voltage VDD reaches a predetermined value (2.5 V), the latch circuit LT outputs the setting signals SETA, /SETA according to the complementary values stored in the memory cells MC1 and MC2. The gate voltages of the transistors PM1 an NM1 are increased depending on the power supply voltage VDD. The gate voltages of the transistors PM2 and NM2 are decreased up to the ground voltage VSS. At this result, the value of the latch circuit LT is automatically decided during the power-on period until the power supply voltage VDD reaches the predetermined voltage. The operating specification of the option functional part 16 is decided by the setting signals SETA, /SETA from the latch circuit LT decided during the power-on period. Consequently, a circuit which generates a reset signal for deciding the operating specification of the option functional part 16 is not required.

The logic levels of the setting signals SETA, /SETA are held by the latch circuit LT during the power supply voltage VDD is supplied to the microcontroller MIC1. Therefore, during the operation of the microcontroller MIC1, the function of the option functional part 16 is not switched. The latch circuit LT is composed of the CMOS inverters INV1 and INV2. For this reason, the feedthrough current of the latch circuit LT disappears after the period (e) that the logic levels of the setting signals SETA, /SETA are decided. The current for holding the setting signals SETA, /SETA is only the leakage component such as substrate current. Accordingly, after the operating specification of the option functional part 16 is switched, unnecessary current can be prevented from flowing in the function switching part 14. At this result, standby current of the microcontroller MIC1 can be prevented from being increased.

The function of the option functional part 16 shown in FIG. 1 is automatically initialized during the power-on period until the power supply voltage VDD reaches the predetermined value, according to the logic level of the setting signals SETA, /SETA. In other words, the function of the option functional part 16 is initially set in a shortest period from the beginning of the power-on period.

As mentioned above, in the first embodiment, the operating specification of the option functional part 16 is automatically decided until the power-on period is completed, according to the program states of the memory cells MC1 and MC2. For this reason, the control circuit for the read operation is not needed and thus the circuit scale of the microcontroller MIC1 can be reduced. Also, a user system on which the microcontroller MIC1 is mounted, the initial process after the power-on period is simplified. Accordingly, the period from when the power is turned on to when the normal operation begins can be shortened. By changing the latch state of the latch circuit LT according to the difference between the values of the currents flowing in the nonvolatile memory cells MC1 and MC2, the operating specification of the option functional part 16 can be surely set without a malfunction of the latch circuit LT.

Figure 6:
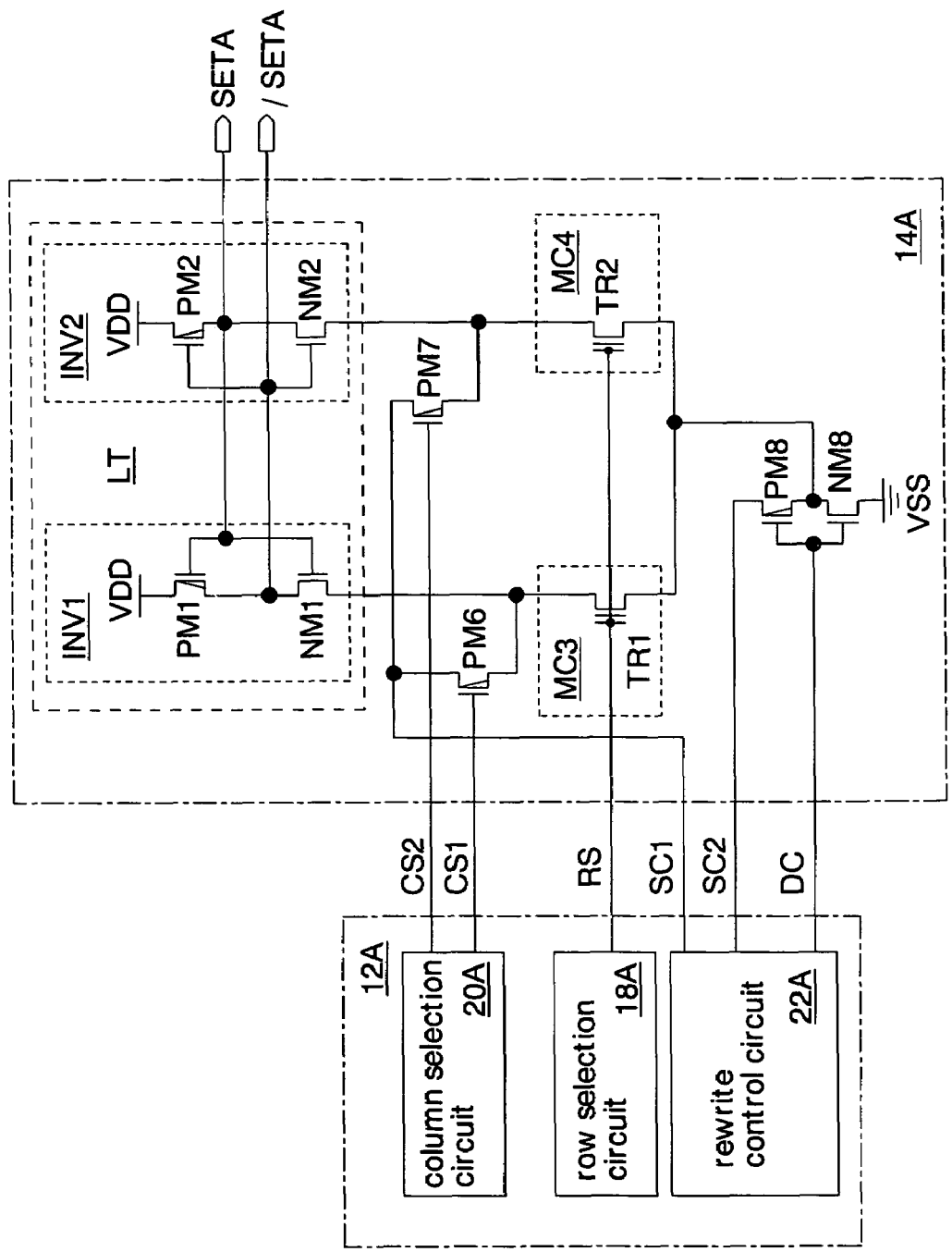
FIG. 6 is a circuit diagram showing in detail a function switching part of a semiconductor integrated circuit according to a second embodiment of the present invention.

FIG. 6 is a circuit diagram showing in detail a function switching part of a semiconductor integrated circuit according to a second embodiment of the present invention. The elements which are equal to those of the first embodiment are attached with the same reference numbers as the first embodiment and thus their description will be omitted. In this embodiment, instead of the write control unit 12 and the function switching part 14 of the first embodiment, the write control unit 12A and the function switching part 14A are formed. The other structures thereof are equal to that of the first embodiment. That is, this semiconductor integrated circuit is formed on a silicon substrate as the microcontroller using a CMOS process technology. Similarly to FIG. 1, a plurality of the function switching part 14A (not shown) are formed in correspondence to a plurality of the option functional parts 18.

The write control unit 12A has a row selection circuit 18A, a column selection circuit 20A and a write control circuit 22A. The row selection circuit 18A, the column selection circuit 20A and the write control circuit 22A supply a predetermined voltage to the source, the drain, and the gate of each of the below-mentioned memory cells MC3 and MC4 in order to perform the erase operation and the write operation of the memory cells MC3 and MC4.

The function switching part 14A has a latch circuit LT, a pair of nonvolatile memory cells MC3, MC4 and pMOS transistors PM6, PM7 and PM8 and an nMOS transistor NM8. The latch circuit LT is equal to that of the first embodiment (FIG. 2). The memory cells MC3 and MC4 has transistors TR1 and TR2 having control gates and floating gates. The erase operation, the write operation and the read operation of the memory cells MC3 and MC4 are performed for the transistors TR1 and TR2.

The drain of the transistor TR1 is connected to the source of the transistor NM1 and receives a control signal SC1 from the write control circuit 22A through the transistor PM6. The drain of the transistor TR2 is connected to the source of the transistor NM2 and receives the control signal SC1 from the write control circuit 22A through the transistor PM7. The sources of the transistors TR1 and TR2 are commonly connected to each other, receive a control signal SC2 from the write control circuit 22A through the transistor PM8, and are connected to a ground line VSS through the transistor NM8. The gates of the transistors TR1 and TR2 receive a control signal RS from the row selection circuit 18A. The gates of the transistors PM6 and PM7 receive control signals CS1 and CS2 from the column selection circuit 20A, respectively. The gates of the transistors PM8 and NM8 receive a control signal DC from the write control circuit 22A.

FIG. 7 illustrates the erase operation and the program operation of the memory cells MC3 and MC4 shown in FIG. 6. For example, in the case that the memory cell MC3 is in the erase state and the memory cell MC4 is in the write state, the write control unit 12A sequentially the erase operation and the write operation, similarly to the first embodiment. In the erase operation and the write operation, the voltages applied to the transistors TR1 and TR2 of the memory cells MC3 and MC4 are the voltages applied to the write transistors CPE1 and CPE2 of the first embodiment. Further, in the below description, the node to which carrier is supplied in the transistor is referred to as a source and the node from which carrier is output is referred to as a drain. The carrier is an electron in the nMOS transistor and is a hole in the pMOS transistor.

In the erase operation, the control signals RS, CS1, CS2, SC1, SC2, and DC are set to −9 V, VDD, VDD, VSS, +5 V, and VSS, respectively. During the erase operation, the control gates of the transistors TR1 and TR2 are set to negative voltage (−9 V). The transistors PM6 and PM7 are turned off and the drains of the transistors TR1 and TR2 are set in the floating state. Since the transistor PM8 is turned on and the transistor NM8 is turned off, the sources of the transistors TR1 and TR2 are set to +5 V. For this reason, the electrons are emitted from the floating gate to the source (tunnel current), and the threshold values of the transistors TR1 and TR2 are decreased. In this embodiment, the threshold voltage becomes the depletion state by the erase operation. That is, the transistors TR1 and TR2 are turned on even when the voltage between the gate and source is 0 V.

On the other hand, in the write operation of the memory cell MC4, the control signals RS, CS1, CS2, SC1, SC2, and DC are set to +9 V, +5 V, VSS, +5 V, VSS, and VDD, respectively. The control gates of the write transistors TR1 and TR2 are set to the high voltage (+9 V). The transistor NM8 is turned on and the sources of the transistors TR1 and TR2 are set to the ground voltage VSS. The transistor PM7 is turned on and the drain of the transistor TR2 is set to +5 V. The transistor PM6 is turned off and the drain of the transistor TR1 is set in the floating state. Accordingly, the current flows only between the drain and source of the memory cell MC4 and the electrons are injected into the floating gate by hot electron injection. That is, the threshold voltage of the transistor TR2 is increased. Since the write operation of the memory cell MC3 is not performed, the threshold voltage of the transistor TR1 is held in the low state. Further, in the case that the memory cell MC4 is set in the erase state and the memory cell MC3 is set in the write state by the write command, the logic levels of the control signals CS1, CS2 are set to be opposite to the above.

Figure 8:
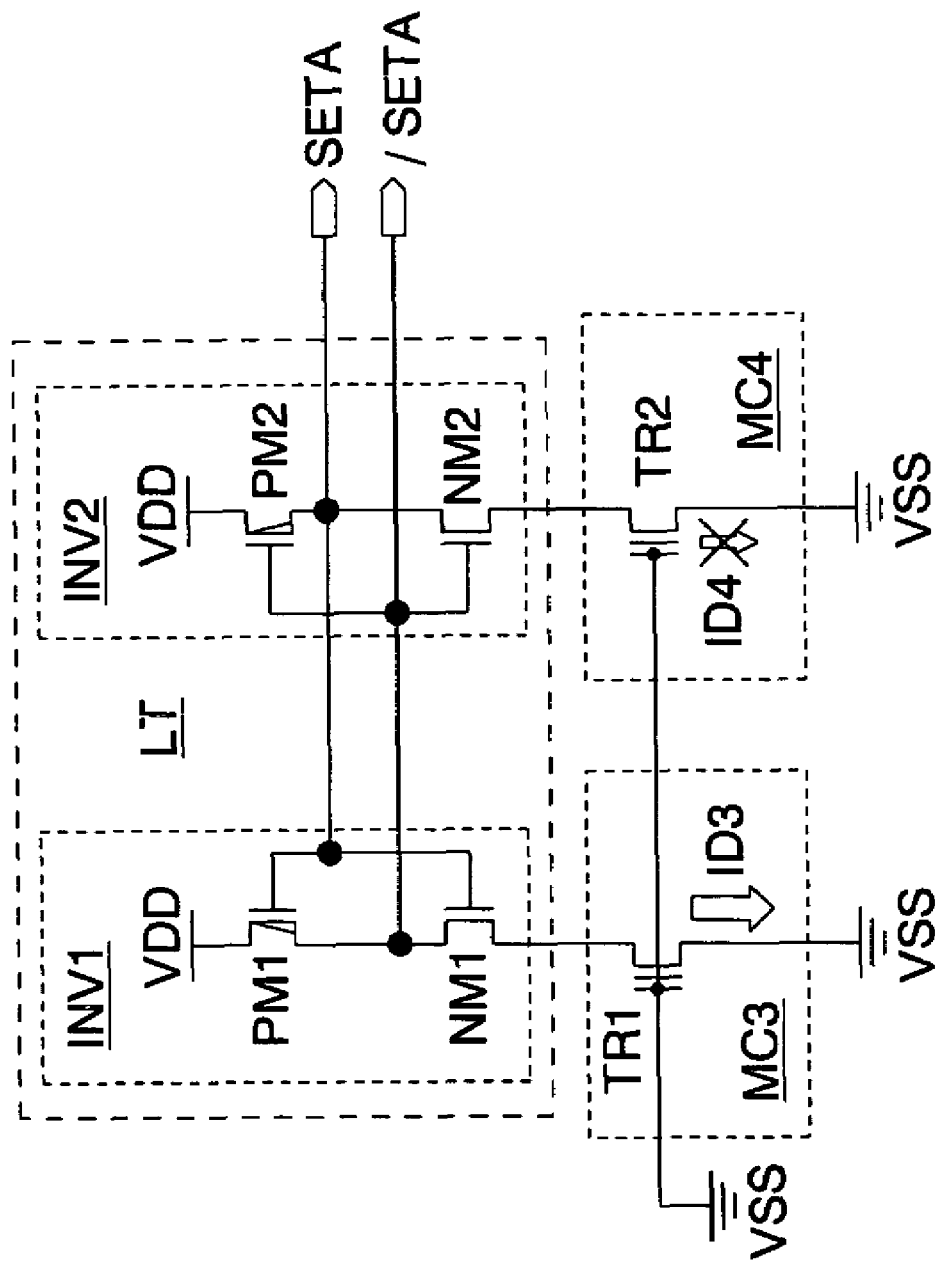
FIG. 8 is a circuit diagram showing a circuit required for deciding a setting signal at the power-on timing, in the function switching part shown in FIG. 6.

FIG. 8 is a circuit diagram showing a circuit required for deciding the setting signals SETA, /SETA at the power-on timing, in the function switching part 14A shown in FIG. 6. Since the write control unit 12A is designed such that the transistors PM6, PM7 and PM8 required for the erase operation and the write operation are turned off at the power-on timing, the transistors are omitted. Since the transistor NM8 is set by the write control circuit 22A such that the gate voltage at the power-on timing becomes the power supply voltage VDD and the sources of the transistors TR1 and TR2 are connected to the ground line VSS, the transistor NM8 is not shown. Further, the row selection circuit 18A is designed such that a control signal RS is set to the ground voltage VSS. For this reason, the sources and the gates of the transistors TR1 and TR2 are connected to the ground line VSS at the power-on timing.

In this example, as mentioned with reference to FIG. 7, previously, the threshold voltage of the memory cell MC3 is set to the low voltage (erase state) and the threshold voltage of the memory cell MC4 is set to the high voltage (write state). The control gates of the transistors TR1 and TR2 are connected to the ground line VSS. Therefore, when the voltage is applied between the drain and the source, the cell current ID3 flows only in the memory cell MC3 and the cell current ID4 does not flow in the memory cell MC4. Accordingly, similarly to the first embodiment, the value of the latch circuit LT is automatically decided during the power-on period until the power supply voltage VDD reaches a predetermined value. That is, the setting signal SETA having the high level and the setting signal /SETA having the low level are output and thus the function of the option functional part 16 is automatically initially-set during the power-on period until the power supply voltage VDD reaches the predetermined value. The operation of the function switching part 14A at the power-on timing is equal to that of the first embodiment (FIG. 5). Accordingly, in the second embodiment, the same effect as the first embodiment can be obtained.

Figure 9:
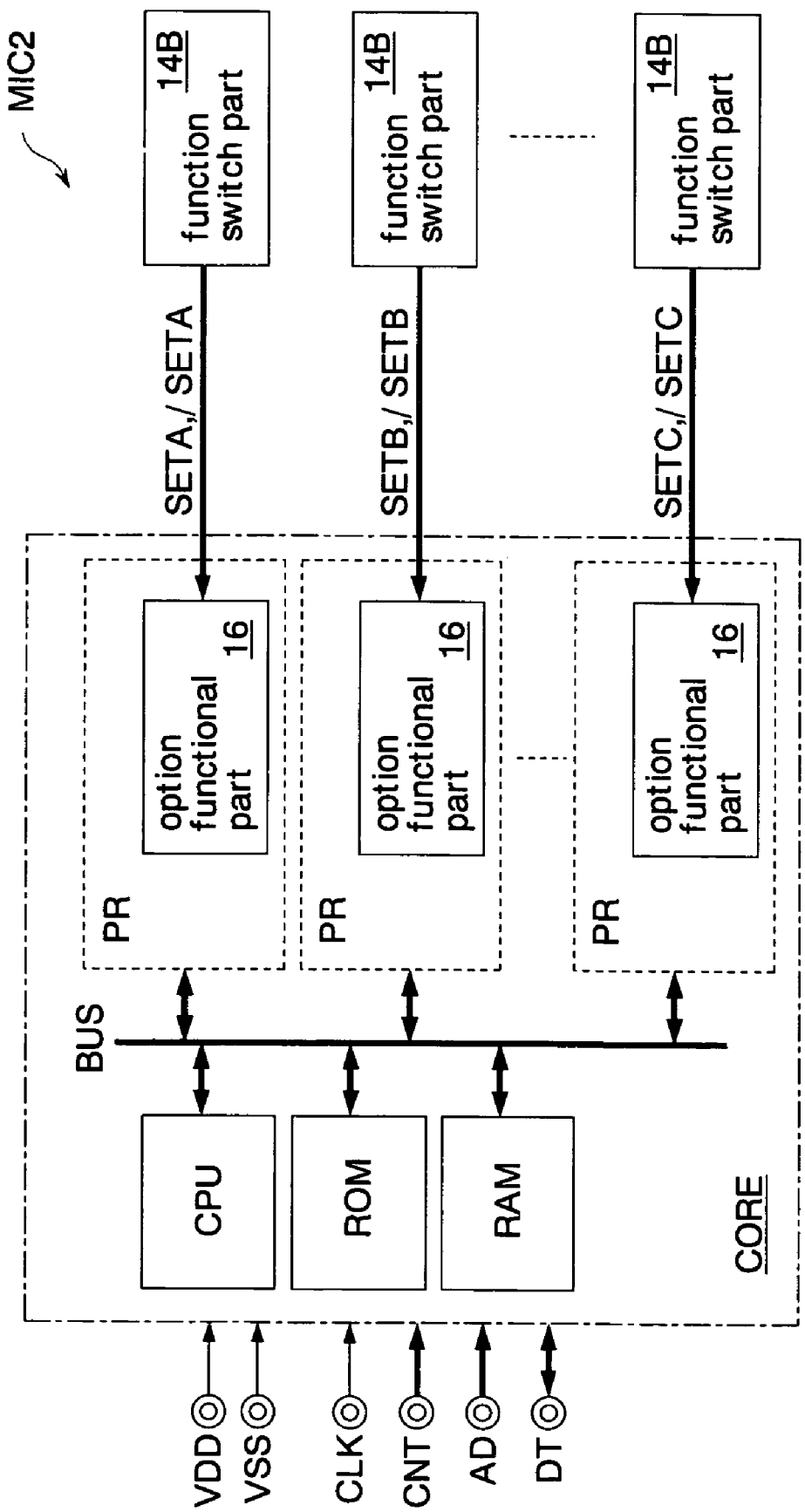
FIG. 9 is a block diagram showing a semiconductor integrated circuit according to a third embodiment of the present invention.

FIG. 9 is a block diagram showing a semiconductor integrated circuit according to a third embodiment of the present invention. The elements which are equal to those of the first embodiment are attached with the same reference numbers as the first embodiment and thus their description will be omitted. The semiconductor integrated circuit of this embodiment is formed as a microcontroller MIC2, for example, using the CMOS process technology. The microcontroller MIC2 has a core unit CORE and a plurality of function switching parts 14B. The core unit CORE has a CPU, a ROM, a RAM and a plurality of peripheral circuits PR such as a timer, a serial communication, and an I/O port. Each peripheral circuit PR has an option functional part 16 for changing the operating specification of the peripheral circuit PR. Similarly to the first embodiment, the function switching parts 14B are formed in correspondence to the option functional parts 16, respectively. The core unit CORE receives a clock signal CLK, a control signal CNT, an address signal AD and inputs and outputs a data signal DT. The core unit CORE and the function switching part 14B receive an external power supply voltage VDD (for example, 2.5 V) and a ground voltage VSS (0 V). The function switching part 14B outputs setting signals SET, /SET (SETA, SETB, SETC, /SETA, /SETB, /SETC) according to the program states of fuses FS1, FS2 shown in FIG. 10. The setting signals SET, /SET are complementary signals.

Figure 10:
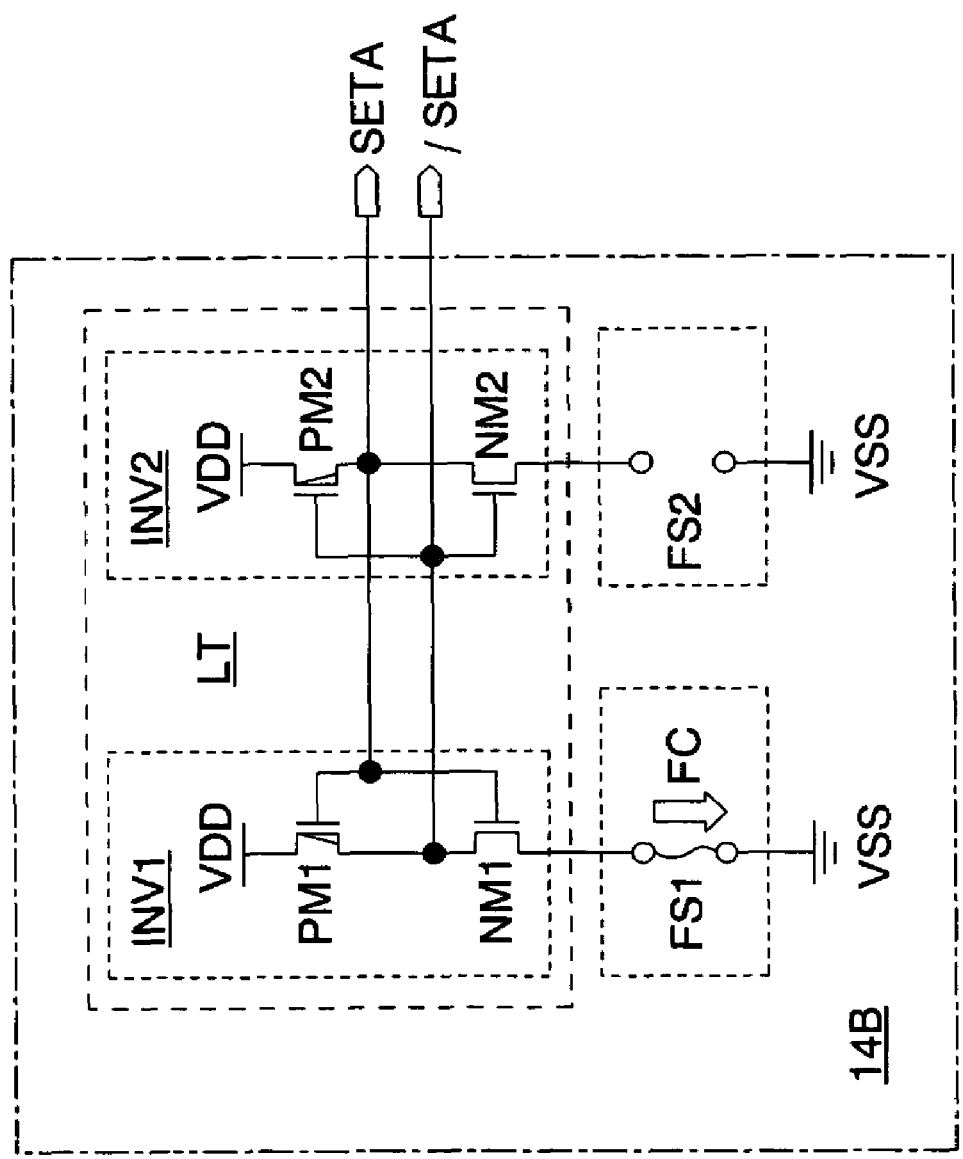
FIG. 10 is a circuit diagram showing in detail the function switch shown in FIG. 9.

FIG. 10 shows in detail the function switch 14B shown in FIG. 9. The function switching part 14B has a latch circuit LT and a pair of the fuses FS1, FS2. The latch circuit LT is equal to that of the first embodiment (FIG. 2). In this embodiment, one of the fuses FS1 and FS2 is cut in a test process after the manufacture of the microcontroller MIC2. That is, the fuses FS1 and FS2 are programmed to different logic values. For example, when the fuse FS2 is cut, only the source of the transistor NM1 of the inverter INV1 is connected to the ground line VSS. Accordingly, feedthrough current FC flows in the inverter INV1 at the power-on timing. The source of the transistor NM2 of the inverter INV2 becomes the floating state. Therefore, the feedthrough current does not flow in the inverter INV2 at the power-on timing.

When the microcontroller MIC2 is turned on, the latch circuit LT latches the value according to the states of the fuses FS1 and FS2 and outputs the latched value as the complementary setting signals SETA, /SETA. In this example, the setting signals SETA, /SETA are set to the power supply voltage VDD (high level) and the ground voltage VSS (low level), respectively. The function of the option functional part 16 shown in FIG. 10 is automatically initially-set during the power-on period until the power supply voltage VDD reaches the predetermined value, according to the logic levels of the setting signals SETA, /SETA. The logic levels of the setting signals SETA, /SETA are not changed during the power supply voltage VDD is supplied to the microcontroller MIC2. For this reason, during the operation of the microcontroller MIC2, the function of the option functional part 16 is not switched.

As mentioned above, in the third embodiment, the same effect as the first embodiment can be obtained. Further, in this embodiment, the currents flowing in the programming element are necessarily different from each other by using a pair of the fuses FS1 and FS2 in the programming element. Accordingly, the operating specification of the option functional part 16 can be surely set, without a malfunction of the latch circuit LT.

In addition, in the first and second embodiments, the example that the function switching parts 14, 14A are formed in order to change the operating specification of the peripheral circuit of the microcontroller MIC1 at the power-on timing was described. The present invention is not limited to this. For example, the function switching part may be formed by the change of the circuit characteristic for improving the operation margin of the microcontroller MIC1. As the change of the circuit characteristic, for example, there are adjustment of a delay time of the internal circuit and adjustment of a voltage value generated by a negative voltage generating circuit and a high voltage generating circuit.

In the above-mentioned second embodiment, the example that is provided with the nonvolatile memory cells MC3 and MV4 having floating gates was described. The present invention is not limited to this. For example, although the nonvolatile memory cell having an insulative trap gate is formed, the same effect can be obtained.

The invention is not limited to the above embodiments and various modifications may be made without departing from the spirit and scope of the invention. Any improvement may be made in part or all of the components.

What is claimed is:

1. A semiconductor integrated circuit comprising:
   an option functional part of which an operating specification can be switched;
   a function switching part which switches the operating specification of said option functional part, wherein:
   said function switching part includes a pair of programming elements to be programmed to different logic values and a decision circuit connected to said programming elements and outputting, during a period in which a power supply voltage rises at a power-on, a logic level according to a difference between currents flowing in said programming elements;
   the operating specification of said option functional part is switched according to the logic level output from said decision circuit.

2. The semiconductor integrated circuit according to claim 1, wherein:
   each of said programming elements is a nonvolatile memory cell composed of a read transistor and a write transistor; and
   said read transistor and said write transistor have a common conductive floating gate which stores charges therein.

3. The semiconductor integrated circuit according to claim 2, wherein:
   a pair of the nonvolatile memory cells are set in a state that a threshold value is negative and in a state that the threshold value is positive, respectively; and
   said read transistor has a control gate connected to a ground line.

4. The semiconductor integrated circuit according to claim 2, further comprising a write control unit which applies a predetermined voltage to a control gate, a source, and a drain of said write transistor to store or emit carriers to said common floating gate.

5. The semiconductor integrated circuit according to claim 4, further comprising an operation control unit which outputs a write command signal according to a control signal supplied through an external terminal, wherein
   said write control unit rewrites a stored value of said programming element during the output of said write command signal.

6. The semiconductor integrated circuit according to claim 1, wherein
   each of said programming elements is a nonvolatile memory cell having a conductive floating gate which stores charges therein and a control gate which stores or emits charges to said floating gate.

7. The semiconductor integrated circuit according to claim 6, further comprising a write control unit which applies a predetermined voltage to a control gate, a source, and a drain of said nonvolatile memory cell in order to store or emit carriers to said floating gate.

8. The semiconductor integrated circuit according to claim 7, further comprising an operation control unit which outputs a write command signal according to a control signal supplied through an external terminal, wherein
   said write control unit rewrites a stored value of said programming element during the output of said write command signal.

9. The semiconductor integrated circuit according to claim 1, wherein each of said programming elements is a nonvolatile memory cell having an insulative trap gate which traps charges and a control gate which traps or emits carriers to said trap gate.

10. The semiconductor integrated circuit according to claim 9, further comprising a write control unit which applies a predetermined voltage to a control gate, a source, and a drain of said nonvolatile memory cell in order to store or emit carriers to said trap gate.

11. The semiconductor integrated circuit according to claim 10, further comprising an operation control unit which outputs a write command signal according to a control signal supplied through an external terminal, wherein said write control unit rewrites a stored value of said programming element during the output of said write command signal.

12. The semiconductor integrated circuit according to claim 1, wherein each of said programming elements is a fuse.

13. The semiconductor integrated circuit according to claim 1, wherein:

said decision circuit has a pair of inverting circuits in which first power supply terminals are connected to a first power supply line and second power supply terminals are connected to said pair of programming elements, respectively, and whose input and output are connected to each other; and said logic level is output from at least one output of said inverting circuits.

14. The semiconductor integrated circuit according to claim 13, wherein:

each of said inverting circuits is a CMOS inverter having a pMOS transistor and an nMOS transistor which are serially connected to each other; and a source of said pMOS transistor is said first power supply terminal and connected to a high voltage line as said first power supply line, and a source of said nMOS transistor is said second power supply terminal and connected to a low voltage line as a second power supply through said programming element.

* * * * *